(12) United States Patent
Kim et al.

(10) Patent No.: US 11,086,342 B1
(45) Date of Patent: Aug. 10, 2021

(54) LOW POWER HIGH SPEED MAXIMUM INPUT SUPPLY SELECTOR

(71) Applicant: QUALCOMM Incorporated, San Diego, CA (US)

(72) Inventors: Jong Jin Kim, San Diego, CA (US); Raymond Rosik, San Diego, CA (US); Michael Naone Farias, San Diego, CA (US); Brett Walker, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/020,121

(22) Filed: Sep. 14, 2020

(51) Int. Cl.
| | | |
|---|---|---|
| *G11C 5/14* | (2006.01) | |
| *G05F 1/46* | (2006.01) | |
| *H03K 5/24* | (2006.01) | |
| *H03K 19/20* | (2006.01) | |

(52) U.S. Cl.
CPC ............ *G05F 1/46* (2013.01); *H03K 5/24* (2013.01); *H03K 19/20* (2013.01)

(58) Field of Classification Search
CPC .... H03K 17/693; H03K 17/005; H03K 17/74; H03K 17/6257; H04J 3/047; G11C 5/147; G05F 1/465; G05F 3/205; G05F 3/262; H04B 1/1623

USPC .......................................... 327/407–408, 530
See application file for complete search history.

(56) References Cited

U.S. PATENT DOCUMENTS

| | | | | |
|---|---|---|---|---|
| 6,040,718 A | * | 3/2000 | Henry ....................... | H03K 5/24 327/407 |
| 8,751,846 B2 | * | 6/2014 | Yu .......................... | H03K 17/693 713/340 |
| 9,298,238 B2 | | 3/2016 | Mann et al. | |

OTHER PUBLICATIONS

Mandal P., et al., "Max-Supply Selector using a Supply Voltage Comparator", International Conference MIXDES 2006, Jun. 22-24, 2006, pp. 327-331.

* cited by examiner

*Primary Examiner* — Anh-Quan Tra
(74) *Attorney, Agent, or Firm* — Patterson & Sheridan, LLP

(57) ABSTRACT

Techniques and apparatus for selecting a maximum input supply voltage from multiple input power supplies. An example maximum input supply selection circuit includes a parallel array of comparators and selection logic to select the maximum input supply voltage, supply present detectors, comparator settling logic including a warm-up delay timer to provide for comparator settling, and comparator enable logic for disabling all comparators and entering an ultra-low power mode.

20 Claims, 6 Drawing Sheets

LOW POWER HIGH SPEED MAXIMUM INPUT SUPPLY SELECTOR

BACKGROUND

Field of the Disclosure

Certain aspects of the present disclosure generally relate to electronic circuits and, more particularly, to a maximum input supply selection circuit and techniques for selecting a maximum input supply voltage.

Description of Related Art

Power management integrated circuits (power management ICs or PMICs) are used for managing the power requirement of a host system and may include and/or control one or more voltage regulators. A PMIC may be used in battery-operated devices, such as mobile phones, tablets, laptops, wearables, etc., to control the flow and direction of electrical power in the devices. The PMIC may perform a variety of functions for the device such as DC-to-DC conversion (e.g., using a voltage regulator as described above), battery charging, power-source selection, voltage scaling, power sequencing, etc.

A voltage regulator provides a constant direct current (DC) output voltage regardless of changes in load current or input voltage. Voltage regulators may be classified as either linear regulators or switching regulators. While linear regulators tend to be small and compact, many applications may benefit from the increased efficiency of a switching regulator. A linear regulator may be implemented by a low-dropout (LDO) regulator, for example. A switching regulator may be implemented by a switched-mode power supply (SMPS), such as a buck converter, a boost converter, a buck-boost converter, or a charge pump.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide a maximum input supply selection circuit. The maximum input supply selection circuit generally includes a parallel array of comparators configured to receive a plurality of input supply voltages and to generate a plurality of selection signals based on the plurality of input supply voltages; a plurality of input supply detectors configured to receive the plurality of input supply voltages and to generate a plurality of input supply detection signals based on the plurality of input supply voltages; comparator enable logic coupled between outputs of the plurality of input supply detectors and one or more inputs of the parallel array of comparators, the comparator enable logic being configured to generate a comparator enable signal based on the plurality of input supply detection signals; maximum input supply selection logic having inputs coupled to outputs of the parallel array of comparators; comparator settling logic coupled between the outputs of the plurality of input supply detectors and one or more inputs of the maximum input supply selection logic and configured to generate a gating signal based on at least one of the plurality of input supply detection signals, wherein the maximum input supply selection logic is configured to generate a plurality of control signals based on the plurality of selection signals and the gating signal; and a plurality of switches having control inputs coupled to outputs of the maximum input supply selection logic, having a common output, and being configured to select between the plurality of input supply voltages based on the plurality of control signals for outputting a maximum input supply voltage at the common output.

Certain aspects of the present disclosure provide a method of supplying power. The method generally includes receiving, at a parallel array of comparators and at a plurality of input supply detectors, a plurality of input supply voltages; generating, with the parallel array of comparators, a plurality of selection signals based on the plurality of input supply voltages; generating, with the plurality of input supply detectors, a plurality of input supply detection signals based on the plurality of input supply voltages; generating, with comparator enable logic coupled between outputs of the plurality of input supply detectors and one or more inputs of the parallel array of comparators, a comparator enable signal based on the plurality of input supply detection signals; generating, with maximum input supply selection logic having inputs coupled to outputs of the parallel array of comparators, a plurality of control signals; generating, with comparator settling logic coupled between the outputs of the plurality of input supply detectors and one or more inputs of the maximum input supply selection logic, a gating signal based on at least one of the plurality of input supply detection signals, wherein the maximum input supply selection logic is configured to generate the plurality of control signals based on the plurality of selection signals and the gating signal; and selecting, with a plurality of switches having control inputs coupled to outputs of the maximum input supply selection logic and having a common output, between the plurality of input supply voltages based on the plurality of control signals for outputting a maximum input supply voltage at the common output.

Certain aspects of the present disclosure provide a power management integrated circuit (PMIC) comprising at least a portion of the maximum input supply selection circuit described herein.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
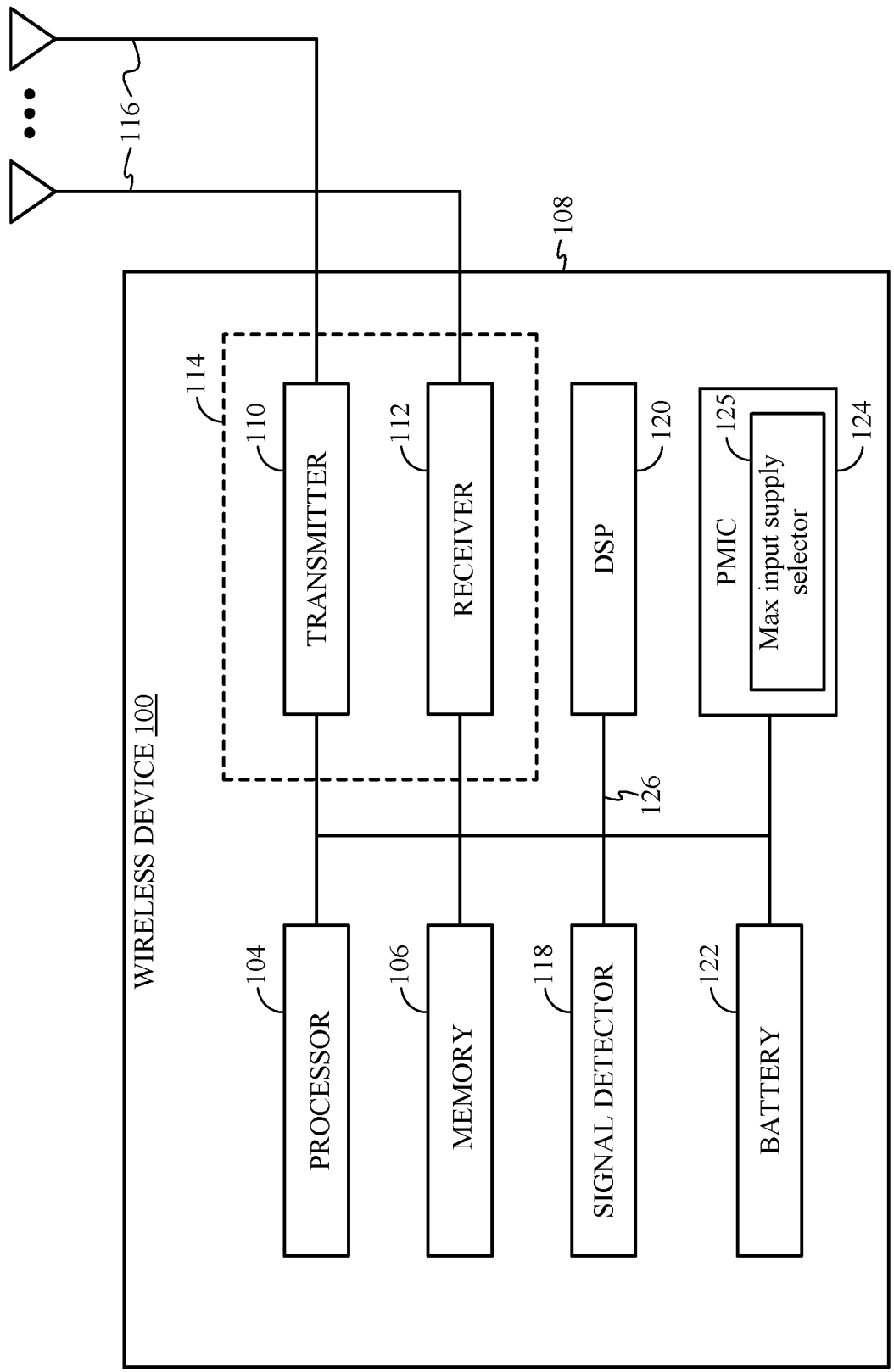
FIG. 1 illustrates a block diagram of an example device that includes a maximum input supply selector, in which various aspects of the present disclosure may be practiced.

Certain aspects of the present disclosure provide techniques and apparatus for selecting a maximum input supply voltage from multiple input power supplies.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and test equipment such as an oscilloscope. Communication systems intended to be included within the scope of the present disclosure include, by way of example only, cellular radiotelephone communication systems, satellite communication systems, two-way radio communication systems, one-way pagers, two-way pagers, personal communication systems (PCSs), personal digital assistants (PDAs), and the like.

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, a wearable device, an Internet of Things (IoT) device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 includes at least a portion of each of multiple power supply circuits, or at least receives voltages from multiple power supply sources (e.g., battery voltage, charger voltages, regulated voltage from a switched-mode power supply, coin cell voltage, and the like). The PMIC 124 may further include at least a portion of a maximum input supply selection circuit 125. The maximum input supply selection circuit 125 may select the highest voltage out of the voltages from the multiple power supply sources for operating various circuits of the PMIC 124, as described below.

The various components of the device 100 may be coupled together by a bus system 126, which may include a power bus, a control signal bus, and/or a status signal bus in addition to a data bus.

Example Maximum Input Supply Selector

A power management integrated circuit (PMIC), such as PMIC 124 of FIG. 1, may receive and/or provide multiple voltages from multiple power supplies, referred to herein as "input supplies." These input supplies are typically at different voltages, although at least some of these input supplies may have the same voltage. The presence of each of the input supplies varies for different use cases (e.g., whether a wall adapter is plugged in to provide a charger voltage (VCHG)). At least one of the input supplies may be an ultra-low power supply with very limited current capacity, such as a coin cell battery.

Figure 2:
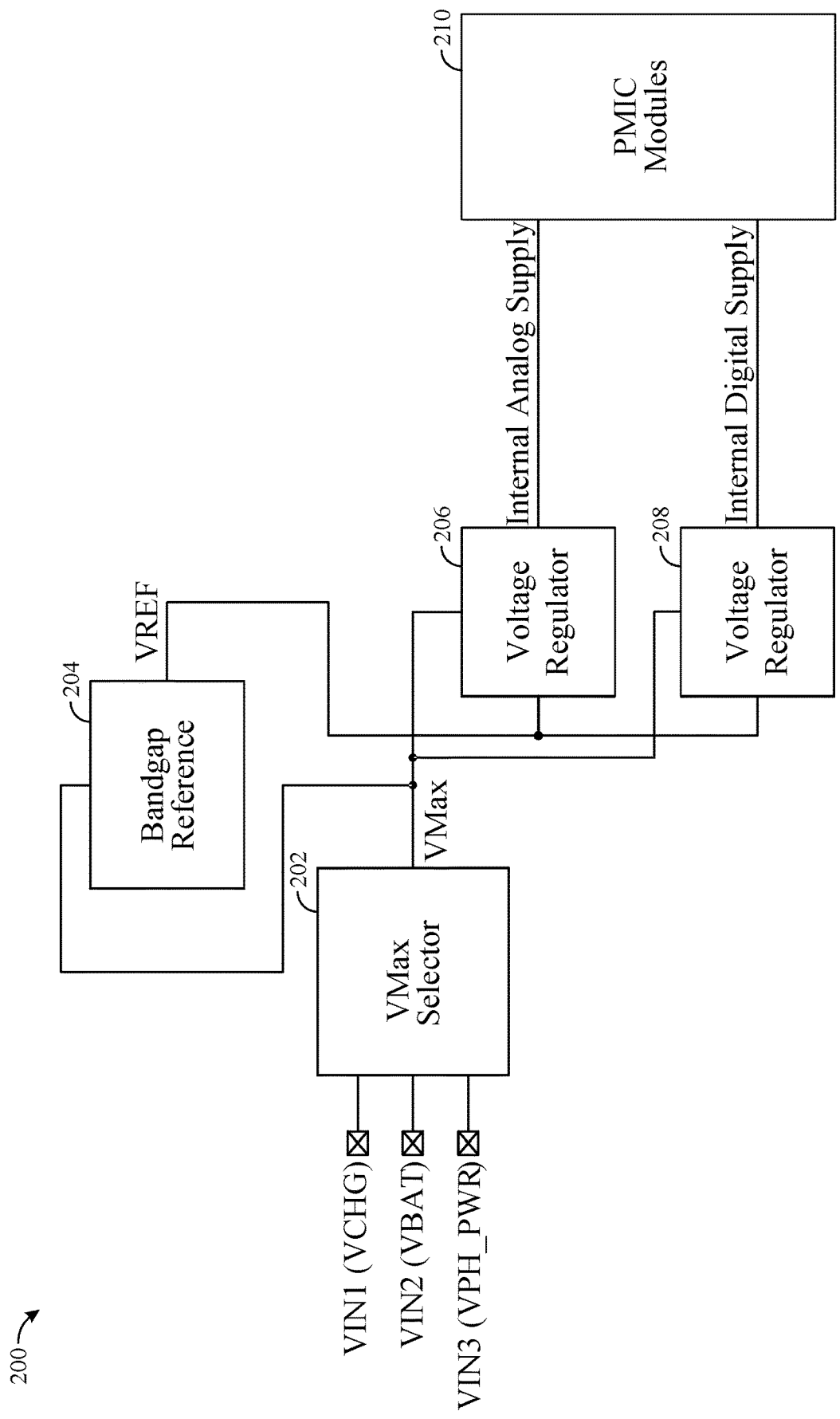
FIG. 2 is a block diagram of an example maximum input supply selector used to select a maximum input supply voltage (Vmax) for powering various circuits, in which various aspects of the present disclosure may be practiced.

Digital and analog circuits within a PMIC (e.g., PMIC modules 210 in the block diagram 200 of FIG. 2) may call for one or more always-ON internal regulated supply rails that come up even in the presence of only one input supply while the device is in an OFF state. The source of the always-ON regulated rail(s) may be a maximum input supply selector 202 for selecting the maximum input supply voltage (Vmax) from various input power supplies, such as a charger voltage (VCHG), a battery voltage (VBAT), and an internally generated power source voltage (VPH POWER) from a switched-mode power supply (SMPS), for example. Vmax should be chosen to be the highest voltage from the various input power supplies. Although three input power supply voltages are illustrated in FIG. 2, it should be understand that any number of multiple of supply voltages may be input to the maximum input supply selector 202.

A reference circuit 204 (e.g., a bandgap reference) and/or one or more voltage regulators 206, 208 (e.g., low dropout regulators (LDOs)) may receive the Vmax input and generate the always-ON regulated internal supplies for digital and analog circuits on the PMIC (e.g., the PMIC modules 210). For example, the PMIC modules 210 may include a battery charging circuit, a buck converter, one or more other LDOs, and/or a crystal oscillator (XO). The maximum input supply selector 202 may also prevent leakage current and allow for test access of signals in the highest voltage domain.

There are several design constraints for an ideal maximum input supply selector in a PMIC. For example, a maximum input supply selector should be self-powered by one of the input supplies and should provide an output equal to the highest input voltage without shorting any of the inputs. A maximum input supply selector should support multiple inputs at various combinations of the same and different voltages. Ideally, a maximum input supply selector should consume ultra-low current (e.g., <<1 μA) to minimize the OFF current and the coin cell current of the device and to maximize the days of use from a battery supply. In addition, a maximum input supply selector may ideally be capable of supporting fast slew rates of input signals (e.g., up to 1 V/μs) and should tolerate some noise and/or load currents on the inputs without toggling back and forth between different input supplies. Furthermore, a maximum input supply selector should support unused inputs to accommodate different customer use cases of a device.

Certain aspects of the present disclosure provide a maximum input supply selector and that meets these design specifications. The maximum input supply selector includes a parallel array of comparators and selection logic to select the maximum input supply, supply present detectors, comparator settling logic including a warm-up delay timer to provide for comparator settling, and comparator enable logic for disabling all comparators and entering an ultra-low power mode.

Figure 3:
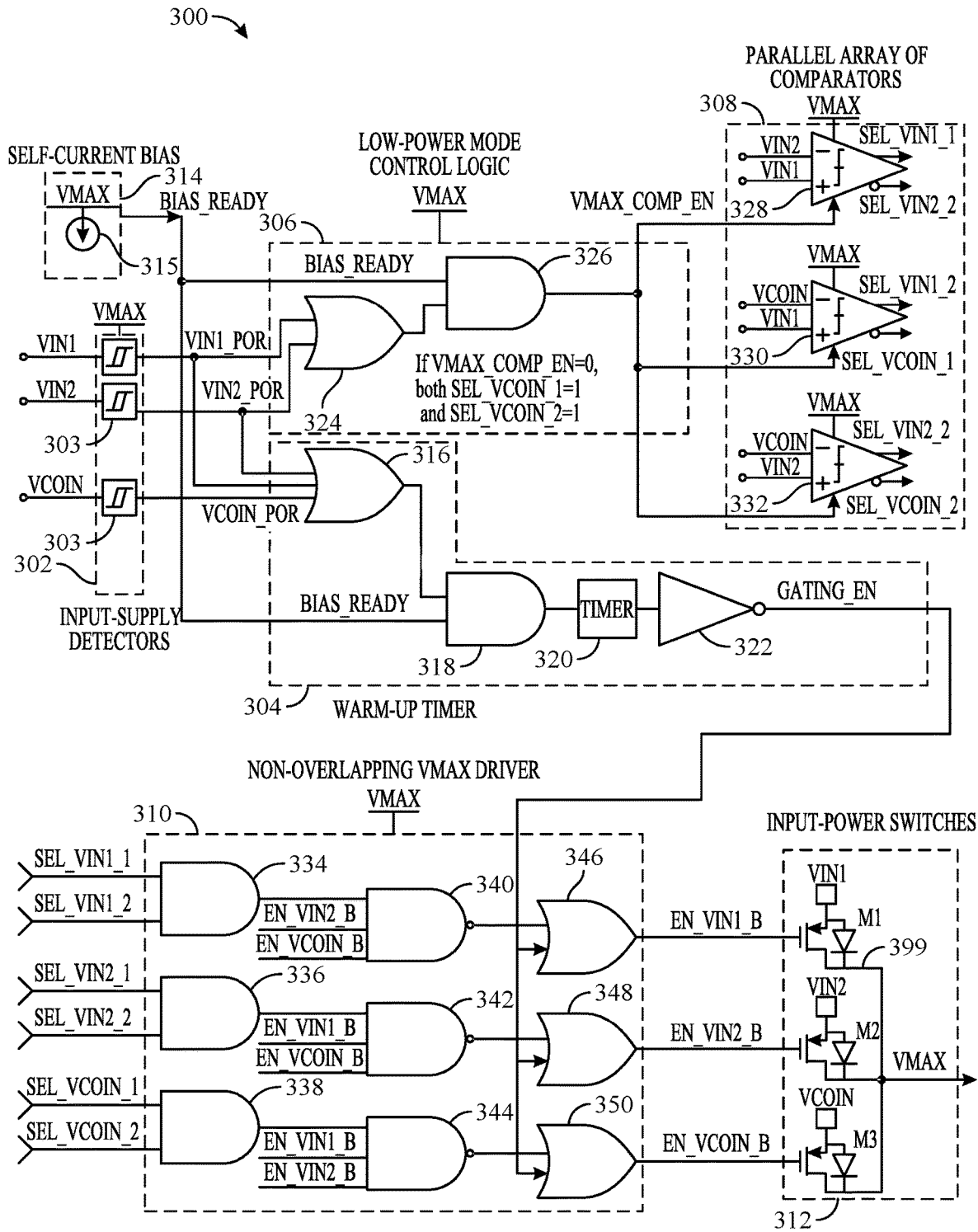
FIG. 3 is a circuit diagram of an example maximum input supply selector, in accordance with certain aspects of the present disclosure.

FIG. 3 is a circuit diagram of an example implementation of such a maximum input supply selector 300, in accordance with certain aspects of the present disclosure. The maximum input supply selector 300 may be used, for example, as the maximum input supply selector 202 of FIG. 2 for selecting Vmax. The maximum input supply selector 300 includes input supply detectors 302, comparator settling logic 304, comparator enable logic 306, a parallel array of comparators 308, maximum input supply selection logic 310, and input-power switches 312.

Figure 4:
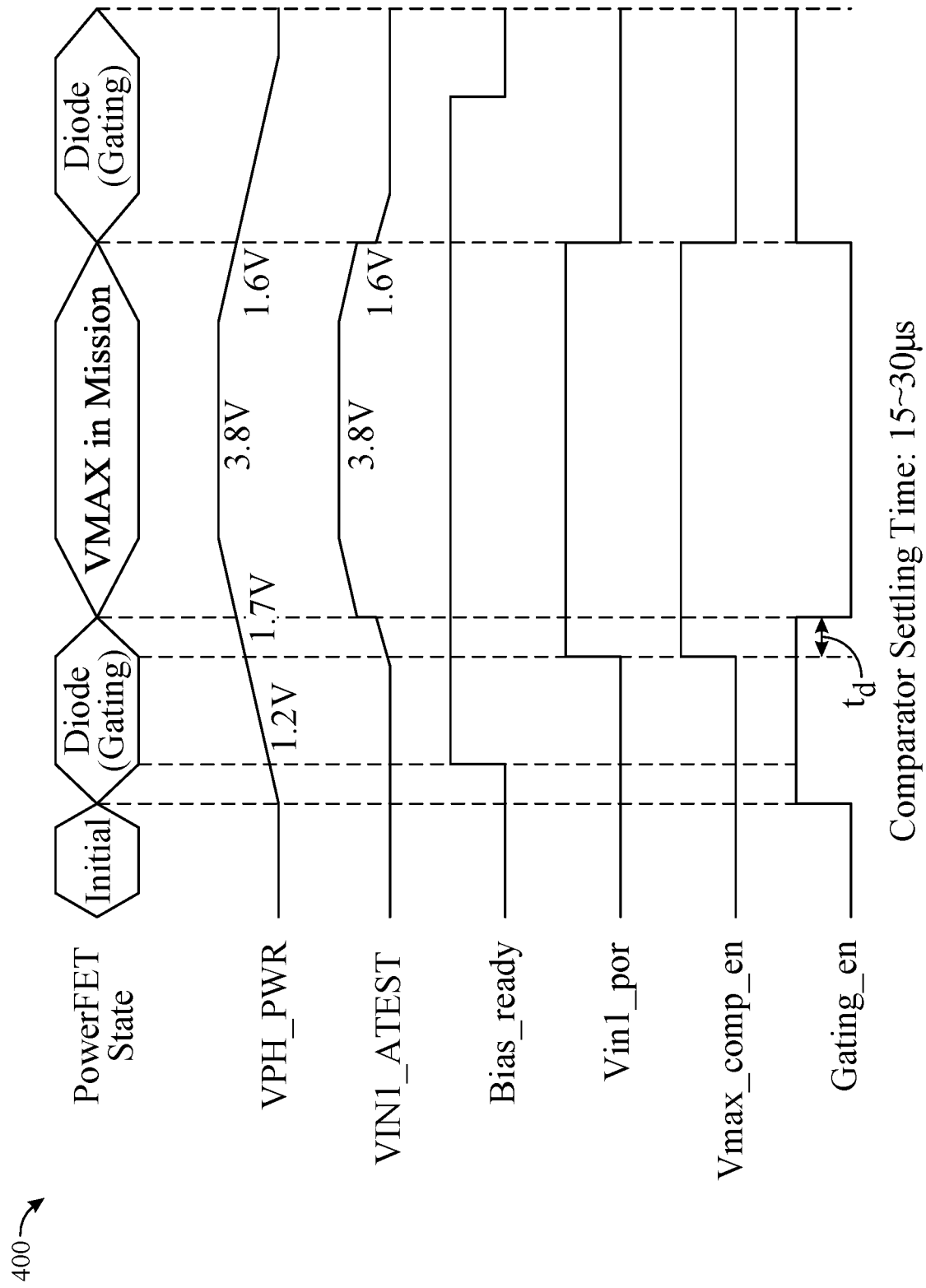
FIG. 4 is an example timing diagram illustrating operation of the example maximum input supply selector of FIG. 3, in accordance with certain aspects of the present disclosure.

FIG. 4 is an example timing diagram 400 illustrating operation of the example maximum input supply selector 300 of FIG. 3, in accordance with certain aspects of the present disclosure. Aspects of the timing diagram 400 will be described in parallel with the circuit components of the maximum input supply selector 300.

For certain aspects, the maximum input supply selector 300 includes a biasing circuit 314. The biasing circuit 314 may be powered by Vmax. For example, the biasing circuit may include a current source 315 powered by Vmax. The biasing circuit may be configured to generate a biasing ready signal (labeled "Bias_ready") based on Vmax (e.g., based on Vmax being above a certain voltage, such as 1.2 V as depicted in FIG. 4). During initial conditions (e.g., as the input supplies are powered up), Vmax may dynamically equal the highest input supply voltage present minus the forward voltage drop of a diode (e.g., a body diode of a field-effect transistor, as explained below). In other words, the biasing circuit 314 may be powered through the body diode of one of the input-power switches 312. This will resolve the initial conditions and is how the maximum input supply selector 300 operates until the maximum input supply selection is actually made (e.g., after the input supplies are powered up).

The input supply detectors 302 are coupled to the various input supplies and are configured to receive the input supply voltages therefrom and to generate input supply detection signals based on the presence of the input supply voltages. For example, the input supply detectors may receive a first input supply voltage (labeled "VIN1," such as VCHG from a charger), a second input supply voltage (labeled "VIN2," such as VBAT from a rechargeable battery of the device), and a third input supply voltage (labeled "VCOIN," from a coin cell battery. While the maximum input supply selector 300 is illustrated as receiving three input supply voltages, the maximum input supply selector may receive more or less than three input supply voltages. The input supply detectors 302 may be implemented by hysteresis comparators 303, for example, which may provide stable input supply detection signals, even in the presence of noise or small transients on the input supply rails. As shown in FIG. 3, the input supply detection signal for VIN1 is labeled "vin1_por," the input supply detection signal for VIN2 is labeled "vin2_por," and the input supply detection signal for VCOIN is labeled "vcoin_por." By using comparators 303 for the input supply detectors 302, an input supply detection signal may not transition to logic high until a corresponding input supply voltage is above a particular voltage threshold (e.g., 1.7 V, as illustrated in FIG. 4). For certain aspects, one or more of the input supply detectors 302 may be powered by Vmax.

The comparator settling logic 304 may include a logical OR gate 316, a logical AND gate 318, a timer 320, and a logical inverter 322. The logical OR gate 316 has inputs coupled to the outputs of the input supply detectors 302 and an output coupled to a first input of the logical AND gate 318. For certain aspects, the logical OR gate 316 may have a number of inputs equal to the number of outputs of the input supply detectors 302, such that the logical OR gate 316 receives all the input supply detection signals. A second input of the logical AND gate is coupled to an output of the biasing circuit 314, and an output of the logical AND gate is coupled to an input of the timer 320. In this manner, if any of the input detection signals is logic high (i.e., at least one of the input supply voltages is present (with a sufficient voltage level)) and the biasing ready signal is logic high, the timer 320 may be triggered to begin the warm-up period. The output of the timer 320 is coupled to the input of the inverter 322, such that a gating signal (labeled "Gating_en") from the output of the inverter transitions from logic high to logic low after expiration of the timer (i.e., the warm-up period ends). The gating signal may remain logic low until none of the input supply detection signals are logic high (e.g., the input supply voltages all fell below a particular voltage level, such as 1.6 V, as portrayed in FIG. 4). For certain aspects, one or more of the components of the comparator settling logic 304 may be powered by Vmax.

The comparator enable logic 306 may include a logical OR gate 324 and a logical AND gate 326. The logical OR gate 324 has inputs coupled to some of the outputs of the input supply detectors 302 and an output coupled to a first input of the logical AND gate 326. For certain aspects, the logical OR gate 324 may have a number of inputs equal to the number of outputs of the input supply detectors 302 minus one, such that the logical OR gate 324 receives all the input supply detection signals except for the one input supply detection signal corresponding to the ultra-low power mode (e.g., vcoin_por). A second input of the logical AND gate is coupled to an output of the biasing circuit 314, and an output of the logical AND gate is coupled to one or more control inputs (e.g., enable inputs) of the parallel array of comparators 308 and is configured to generate a comparator enable signal (labeled "Vmax_comp_en"). In this manner, if any of the input detection signals besides vcoin_por is logic high (i.e., at least one of the input supply voltages is present (with a sufficient voltage level)) and the biasing ready signal is logic high, the comparator enable signal will transition from logic low to logic high, thereby enabling the parallel array of comparators 308. If vcoin_por is the only logic high input detection signal, then the comparator enable signal will remain at or transition to logic low, thereby disabling the parallel array of comparators 308. For certain aspects, one or more of the components of the comparator enable logic 306 may be powered by Vmax.

The parallel array of comparators 308 may include multiple comparators 328, 330, 332. Although three comparators are shown in FIG. 3, the parallel array of comparators 308 may include more or less than three comparators based on the number of input supplies. Each of the comparators may have an enable input (labeled "Vmax_comp_en") coupled to the output of the comparator enable logic 306, such that the comparators are disabled when the enable input is logic low and are enabled when the enable input is logic high. The comparator 328 may have a positive input coupled to the first input supply rail and configured to receive the first input supply voltage (VIN1) and a negative input coupled to the second input supply rail and configured to receive the second input supply voltage (VIN2). The comparator 328 may have a positive output that is configured to generate a first selection signal (labeled "Sel_VIN1_1") that is logic high when VIN1 is greater than VIN2 and may have a negative output that is configured to generate a second selection signal (labeled "Sel_VIN2_1") that is logic high when VIN2 is greater than VIN1. The comparator 330 may have a positive input coupled to the first input supply rail and configured to receive the first input supply voltage (VIN1) and a negative input coupled to the third input supply rail and configured to receive the third input supply voltage (VCOIN). The comparator 330 may have a positive output that is configured to generate a third selection signal (labeled "Sel_VIN1_2") that is logic high when VIN1 is greater than VCOIN and may have a negative output that is configured to generate a fourth selection signal (labeled "Sel_VCOIN_1") that is logic high when VCOIN is greater than VIN1. The comparator 332 may have a positive input coupled to the second input supply rail and configured to receive the second input supply voltage (VIN2) and a negative input coupled to the third input supply rail and configured to receive the third input supply voltage (VCOIN). The comparator 332 may have a positive output that is configured to generate a fifth selection signal (labeled "Sel_VIN2_2") that is logic high when VIN2 is greater than VCOIN and may have a negative output that is configured to generate a sixth selection signal (labeled "Sel_VCOIN_2") that is logic high when VCOIN is greater than VIN2. By induced positive feedback, the comparators (e.g., the comparators 328, 330, 332) may exhibit hysteresis between the two inputs to prevent oscillation (back-and-forth selection between the input supply voltages). If the parallel array of comparators 308 is disabled (e.g., Vmax_comp_en is logic low), both the fourth and sixth selection signals (Sel_VCOIN_1 and Sel_VCOIN_2) may be logic high. For certain aspects, one or more of the components (e.g., the comparators 328, 330, 332) of the parallel array of comparators 308 may be powered by Vmax.

The maximum input supply selection logic 310 may include logic configured to receive the selection signals from the parallel array of comparators 308 and output control signals for closing the switch (in the input-power switches 312) corresponding to the input supply with the highest voltage, thereby selecting Vmax. The maximum input supply selection logic 310 may include a logic path for each of the input supplies, each logic path including a logical AND gate, a logical NAND gate, and a logical OR gate. For example, since three input supplies (VIN1, VIN2, and VCOIN) are provided to the maximum input supply selector 300, the maximum input supply selection logic 310 includes three logic paths.

The first logic path includes a first logical AND gate 334 having an input coupled to each comparator output with a selection signal (Sel_VIN1_1 and Sel_VIN1_2) associated with the first input supply voltage (VIN1) from the parallel array of comparators 308. Although the first logical AND gate 334 has two inputs in FIG. 3, this AND gate may have more inputs if more than three input supplies were input to the maximum input supply selector 300, such that more comparisons were made and more selection signals associated with VIN1 were generated. The output of the first logical AND gate 334 is coupled to an input of a first logical NAND gate 340, which has an output coupled to a first input of a first logical OR gate 346, the second input of the first logical OR gate 346 being coupled to the output of the comparator settling logic 304 (e.g., the output of the inverter 322). The output of the first logical OR gate 346 is a first control signal (labeled "en_VIN1_b") associated with the first input supply. The other inputs to the first logical NAND gate 340 are coupled to the outputs of the other logic paths, such that the first logical NAND gate is configured to receive the other control signals associated with the other input supplies. In this manner, the first control signal is logic low if the gating signal is logic low, both the first and second selection signals (Sel_VIN1_1 and Sel_VIN1_2) are logic high (meaning that VIN1 was higher than both VIN2 and VCOIN), and the other control signals are all logic high.

The second logic path includes a second logical AND gate 336 having an input coupled to each comparator output with a selection signal (Sel_VIN2_1 and Sel_VIN2_2) associated with the second input supply voltage (VIN2) from the parallel array of comparators 308. The output of the second logical AND gate 336 is coupled to an input of a second logical NAND gate 342, which has an output coupled to a first input of a second logical OR gate 348, the second input of the second logical OR gate 348 being coupled to the output of the comparator settling logic 304 and configured to receive the gating signal (Gating_en). The output of the second logical OR gate 348 is a second control signal (labeled "en_VIN2_b") associated with the second input supply. The other inputs to the second logical NAND gate 342 are coupled to the outputs of the other logic paths, such that the second logical NAND gate is configured to receive the other control signals associated with the other input supplies. In this manner, the second control signal is logic low if the gating signal is logic low, both the third and fourth selection signals (Sel_VIN2_1 and Sel_VIN2_2) are logic high (meaning that VIN2 was higher than both VIN1 and VCOIN), and the other control signals are all logic high.

The third logic path includes a third logical AND gate 338 having an input coupled to each comparator output with a selection signal (Sel_VCOIN_1 and Sel_VCOIN_2) associated with the third input supply voltage (VCOIN) from the parallel array of comparators 308. The output of the third logical AND gate 338 is coupled to an input of a third logical NAND gate 344, which has an output coupled to a first input of a third logical OR gate 350, the second input of the third logical OR gate 350 being coupled to the output of the comparator settling logic 304 and configured to receive the gating signal (Gating_en). The output of the third logical OR gate 350 is a third control signal (labeled "en_VCOIN_b") associated with the third input supply. The other inputs to the third logical NAND gate 344 are coupled to the outputs of the other logic paths, such that the third logical NAND gate is configured to receive the other control signals (en_VIN1_b and en_VIN2_b) associated with the other input supplies. In this manner, the third control signal is logic low if the gating signal is logic low, both the fifth and sixth selection signals (Sel_VCOIN_1 and Sel_VCOIN_2) are logic high (meaning that VCOIN was higher than both VIN1 and VIN2, most likely since VCOIN was the only voltage present), and the other control signals (en_VIN1_b and en_VIN2_b) are all logic high.

For certain aspects, one or more of the components of the maximum input supply selection logic 310 may be powered by Vmax. That is, the maximum input supply selection logic 310 may have a power rail coupled to the output of the maximum input supply selector 300. For example, each of the logic paths in the maximum input supply selection logic 310 may be powered by Vmax.

The input-power switches 312 may include a switch associated with each of the input supplies. For example, the input-power switches 312 may include three switches since three input supplies are provided to the maximum input supply selector 300 of FIG. 3. The switches may be implemented by p-type field-effect transistors (PFETs) as illustrated. For example, PFET M1 may have a source coupled to the first input supply rail (VIN1), a drain coupled to a common output 399, and a gate coupled to the output of the first logic path (e.g., the output of the first logical OR gate 346). In this manner, when the first control signal (en_VIN1_b) is logic low, PFET M1 is activated, and the first input supply voltage (VIN1) is selected to be Vmax at the common output 399. Similarly, PFET M2 may have a source coupled to the second input supply rail (VIN2), a drain coupled to the common output 399, and a gate coupled to the output of the second logic path (e.g., the output of the second logical OR gate 348). In this manner, when the second control signal (en_VIN2_b) is logic low, PFET M2 is activated, and the second input supply voltage (VIN2) is selected to be Vmax at the common output 399. PFET M3 may have a source coupled to the third input supply rail (VCOIN), a drain coupled to the common output 399, and a gate coupled to the output of the third logic path (e.g., the output of the third logical OR gate 350). In this manner, when the third control signal (en_VCOIN_b) is logic low, PFET M3 is activated, and the second input supply voltage (VCOIN) is selected to be Vmax at the common output 399.

With the maximum input supply selector as described herein (e.g., the selector 300 of FIG. 3 or a similar circuit topology for a different number of input supplies), the parallel array of comparators is used to generate the selection signals that effectively select the maximum input supply voltage that is present. This circuit topology may reduce the delay time and allow the maximum input supply selector to respond to high slew rate input supplies very quickly without any voltage dips or transient latch-up on the output (e.g., common output 399). The circuit topology (e.g., with the timer for the warm-up period) may provide a consistent delay for the detection of all input supplies. In addition, this circuit topology is expandable to many input supplies and is not limited by voltage headroom of the comparators in a daisy chain. The parallel array of comparators may provide for high accuracy selection capable of detecting the correct input supply voltage to be Vmax for input supply voltages that can be very close. Furthermore, the parallel array of comparators compares all input supplies equally against each other without setting a switchover threshold based on a voltage divider from any one of the input supplies and enables precise hysteresis in the switchover threshold to prevent oscillation between inputs due to source impedances of the input supplies and/or load currents on Vmax.

Also with the circuit topology described herein, the input supply detectors 302 help ensure that one or more of the input supplies is above a threshold voltage before enabling the comparators and using the selection signals generated by the comparators to select the correct supply voltage to be Vmax. The input supply detectors 302 also assist enabling power savings for coin-cell-only use cases by detecting when the coin cell is the only input supply that is present and valid.

The comparator settling logic 304 (including the warm-up delay timer) and masking logic (e.g., the logical OR gates 346, 348, 350) may keep the switches open (e.g., the transistors OFF) until the bias (from the biasing circuit 314) and the comparators are fully settled. This allows warm-up time for the comparators to settle and accurately select the correct input supply before controlling any input power switch to select the maximum input supply. This portion of the circuit topology also prevents high cross-conduction currents and transient latch-up for use cases that have an unused input connected to electrical ground (GND) by giving the comparators time to correctly choose between the input supplies. During warm up, the comparators might otherwise have an unknown output that can select the incorrect input supply momentarily while the comparator receives the bias and settles to a valid operating point. If an input supply that is connected to GND is selected, the Vmax output may be mid-rail, which may squeeze the comparators on supply headroom and latch in an incorrect switch selection with an undefined output. The comparator settling logic 304 and the masking logic functions to prevent this scenario with incorrect input supply selection.

The ultra-low power mode control logic (e.g., comparator enable logic 306) may be used to disable all comparators and force selection of VCOIN to save power when the coin cell is the only input supply present. This may extend the hours of use from the coin cell supply by minimizing (or at least reducing) the coin cell current.

Example Operations for Selecting Vmax

Figure 5:
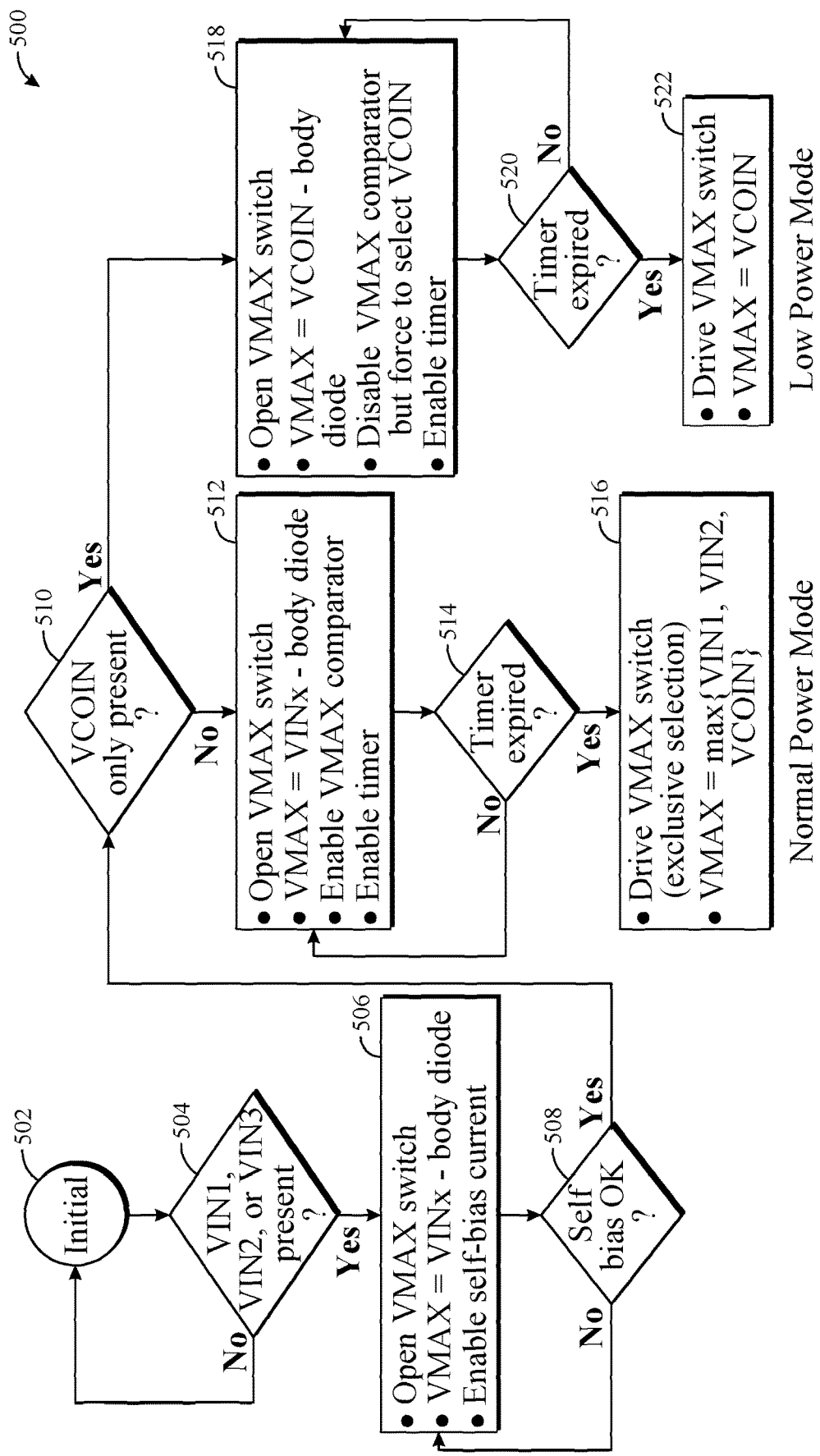
FIG. 5 is a flow chart of an example process for selecting Vmax, in accordance with certain aspects of the present disclosure.

FIG. 5 is a flow chart of an example process 500 for selecting Vmax, in accordance with certain aspects of the present disclosure. The process 500 may be performed by a maximum input supply selector (e.g., the maximum input supply selector 300 of FIG. 3), in accordance with certain aspects of the present disclosure.

The process 500 may begin at initial state 502. From this initial state 502, the maximum input supply selector may determine whether any of the input supply voltages (e.g., VIN1, VIN2, and/or VIN3 (VCOIN)) are present at decision block 504. If not, then the supply selector may loop back to the initial state 502 to make the determination again.

Once one or more of the input supply voltages are present as determined at decision block 504, the supply selector may open the input-power switches 312 at block 506. This may be accomplished through the Gating_en signal and the body diodes in the PFETs. More specifically, as the input supplies are powered up, Vmax at the common output 399 may dynamically equal the highest input supply voltage minus a forward voltage drop across the body diode of the associated PFET. Vmax may also be used to power the inverter 322, which is providing the gating signal to the logical OR gates (e.g., gates 346, 348, 350) in each of the logical paths. Thus, as the input supplies are powered up, Vmax increases, the gating signal becomes a logical high, and the control signals become logic high, thereby opening the input-power switches 312. Also at block 506, the biasing circuit (e.g., biasing circuit 314) may be turned on, due to the increased Vmax supplied to power the biasing circuit, thereby enabling the self-bias current. If the self-bias current is not sufficient as determined at decision block 508, the supply selector may loop back to block 506 to wait. Once the self-bias current is sufficient as determined at decision block 508, the supply selector may determine if only the ultra-low power input supply voltage (e.g., VCOIN) is present at decision block 510.

If at least one other input supply voltage is determined to be present at decision block 510, then at block 512, the input-power switches are kept open, and Vmax equals the highest input supply voltage present minus the forward voltage drop of the body diode of the associated PFET. Also, at block 512, the supply selector enables the parallel array of comparators (e.g., through the comparator enable logic 306 with Vmax_comp_en) and starts the timer (e.g., timer 320 in the comparator settling logic 304). If the timer has not expired as determined at decision block 514, the supply selector may loop back to block 512 to wait. Once the timer expires as determined at decision block 514, the gating signal transitions to logic low and the Vmax driver circuit (e.g., maximum input supply selection logic 310) may be used to drive the input-power switches, such that Vmax is correctly and exclusively selected to be the maximum input supply voltage out of all the input supply voltages presented to the supply selector.

If no other input supply voltage is determined to be present at decision block 510, then at block 518, the input-power switches are kept open, and Vmax equals the ultra-low power input supply voltage (e.g., VCOIN) minus the forward voltage drop of the body diode of the associated PFET. Also, at block 518, the supply selector disables the parallel array of comparators (e.g., through the comparator enable logic 306 with Vmax_comp_en), forces the selection of the ultra-low power input supply voltage, and starts the timer (e.g., timer 320 in the comparator settling logic 304). If the timer has not expired as determined at decision block 520, the supply selector may loop back to block 518 to wait. Once the timer expires as determined at decision block 520, the gating signal transitions to logic low, and the Vmax driver circuit (e.g., maximum input supply selection logic 310) may be used to drive the input-power switches, such that Vmax is selected to be the ultra-low power input supply voltage (e.g., VCOIN).

Figure 6:
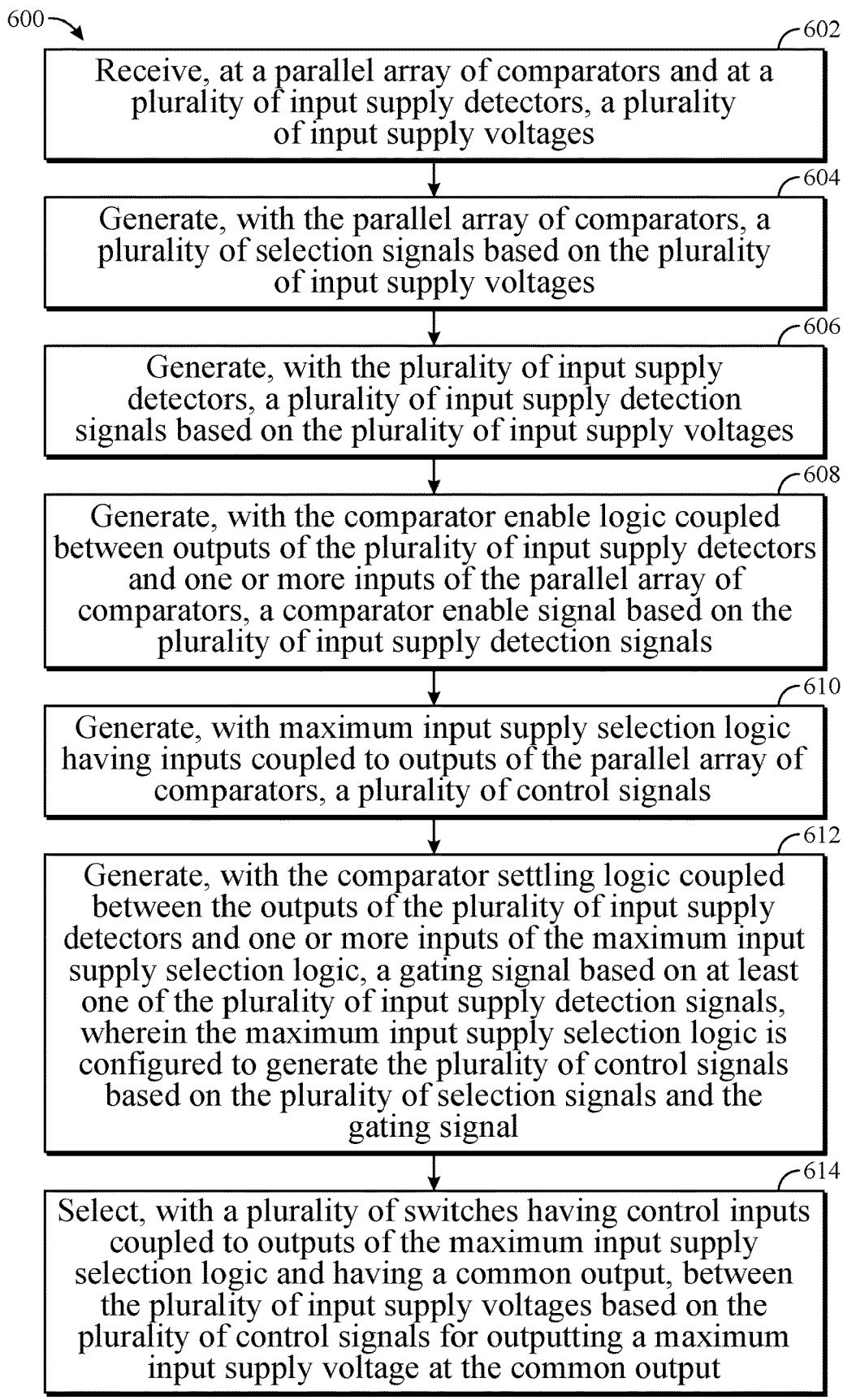
FIG. 6 is a flow diagram of example operations for supplying power, in accordance with certain aspects of the present disclosure.

FIG. 6 is a flow diagram of example operations 600 for supplying power, in accordance with certain aspects of the present disclosure. The operations 600 may be performed by a maximum input supply selection circuit (e.g., the maximum input supply selector 300), in accordance with certain aspects of the present disclosure.

The operations 600 may begin, at block 602, with the maximum input supply selection circuit receiving a plurality of input supply voltages (e.g., VIN1, VIN2, VCOIN) at a parallel array of comparators (e.g., parallel array of comparators 308) and at a plurality of input supply detectors (e.g., input supply detectors 302). At block 604, the parallel array of comparators may generate a plurality of selection signals (e.g., Sel_VIN1_1, Sel_VIN2_1, Sel_VIN1_2, etc.) based on the plurality of input supply voltages. At block 606, the plurality of input supply detectors may generate a plurality of input supply detection signals (e.g., vin1_por, vin2_por, vcoin_por) based on the plurality of input supply voltages.

At block 608, comparator enable logic (e.g., comparator enable logic 306) may generate a comparator enable signal (e.g., Vmax_comp_en) based on the plurality of input supply detection signals. The comparator enable logic may be coupled between outputs of the plurality of input supply detectors and one or more inputs of the parallel array of comparators.

At block 610, maximum input supply selection logic (e.g., maximum input supply selection logic 310) may generate a plurality of control signals (e.g., en_VIN1_b, en_VIN2_b, and en_VCOIN_b). The maximum input supply selection logic may have inputs coupled to outputs of the parallel array of comparators.

At block 612, comparator settling logic (e.g., comparator settling logic 304) may generate a gating signal (e.g., Gating_en) based on at least one of the plurality of input supply detection signals. The comparator settling logic may be coupled between the outputs of the plurality of input supply detectors and one or more inputs of the maximum input supply selection logic. In this case, the maximum input supply selection logic may be configured to generate the plurality of control signals based on the plurality of selection signals and the gating signal.

At block 614, a plurality of switches (e.g., switches 312) may select between the plurality of input supply voltages based on the plurality of control signals for outputting a maximum input supply voltage (Vmax) at a common output of the plurality of switches. The plurality of switches may have control inputs (e.g., gates of transistors M1, M2, and M3) coupled to outputs of the maximum input supply selection logic.

According to certain aspects, the operations 600 further involve concurrently enabling or disabling comparators (e.g., comparators 328, 330, and 332) in the parallel array of comparators based on the comparator enable signal.

According to certain aspects, the operations 600 further entail powering at least one of the parallel array of comparators, the plurality of input supply detectors, the comparator enable logic, the maximum input supply selection logic, or the comparator settling logic with the maximum input supply voltage.

According to certain aspects, the operations 600 further include generating, with a biasing circuit (e.g., biasing circuit 314) comprising a current source (e.g., current source 315) powered by the maximum input supply voltage, a biasing ready signal (e.g., Bias_ready) based on the maximum input supply voltage. For certain aspects, generating the comparator enable signal at block 608 involves generating the comparator enable signal based on the plurality of input supply detection signals and the biasing ready signal, and/or generating the gating signal at block 612 entails generating the gating signal based on the at least one of the plurality of input supply detection signals and the biasing ready signal.

According to certain aspects, the plurality of input supply voltages includes a low supply voltage from a low voltage battery. In this case, the operations 600 may further involve disabling, with the comparator enable logic, the parallel array of comparators using the comparator enable signal if the plurality of input supply detection signals indicates only the low supply voltage is detected out of the plurality of input supply voltages. In response to the parallel array of comparators being disabled, generating the plurality of control signals with the maximum input supply selection logic at block 610 may entail generating one of the plurality of control signals to control one of the plurality of switches coupled between the low voltage battery and the common output to select the low supply voltage as the maximum input supply voltage. For example, the low supply voltage may be a coin voltage (e.g., VCOIN), and the battery may comprise a coin cell configured to generate the coin voltage.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A maximum input supply selection circuit comprising:
   a parallel array of comparators configured to receive a plurality of input supply voltages and to generate a plurality of selection signals based on the plurality of input supply voltages;
   a plurality of input supply detectors configured to receive the plurality of input supply voltages and to generate a plurality of input supply detection signals based on the plurality of input supply voltages;
   comparator enable logic coupled between outputs of the plurality of input supply detectors and one or more inputs of the parallel array of comparators, the comparator enable logic being configured to generate a comparator enable signal based on the plurality of input supply detection signals;
   maximum input supply selection logic having inputs coupled to outputs of the parallel array of comparators;
   comparator settling logic coupled between the outputs of the plurality of input supply detectors and one or more inputs of the maximum input supply selection logic and configured to generate a gating signal based on at least one of the plurality of input supply detection signals, wherein the maximum input supply selection logic is configured to generate a plurality of control signals based on the plurality of selection signals and the gating signal; and
   a plurality of switches having control inputs coupled to outputs of the maximum input supply selection logic, having a common output, and being configured to select between the plurality of input supply voltages based on the plurality of control signals for outputting a maximum input supply voltage at the common output.

2. The maximum input supply selection circuit of claim 1, wherein comparators in the parallel array of comparators are concurrently enabled or disabled based on the comparator enable signal.

3. The maximum input supply selection circuit of claim 1, wherein at least one of the parallel array of comparators, the plurality of input supply detectors, the comparator enable logic, the maximum input supply selection logic, or the comparator settling logic has a power rail coupled to the common output of the plurality of switches and is configured to be powered by the maximum input supply voltage.

4. The maximum input supply selection circuit of claim 1, further comprising a biasing circuit comprising a current source powered by the maximum input supply voltage and configured to generate a biasing ready signal based on the maximum input supply voltage.

5. The maximum input supply selection circuit of claim 4, wherein the comparator enable logic is configured to generate the comparator enable signal based on the plurality of input supply detection signals and the biasing ready signal.

6. The maximum input supply selection circuit of claim 4, wherein the comparator enable logic comprises:
   a logical OR gate configured to generate a logic OR signal based on the plurality of input supply detection signals; and
   a logical AND gate configured to generate the comparator enable signal based on the logic OR signal from the logical OR gate and the biasing ready signal.

7. The maximum input supply selection circuit of claim 4, wherein the comparator settling logic is configured to generate the gating signal based on the at least one of the plurality of input supply detection signals and the biasing ready signal.

8. The maximum input supply selection circuit of claim 7, wherein the comparator settling logic comprises:
   a logical OR gate configured to generate a logic OR signal based on the plurality of input supply detection signals;
   a logical AND gate configured to generate a logic AND signal based on the logic OR signal from the logical OR gate and the biasing ready signal;
   a timer having an input coupled to an output of the logical AND gate; and
   an inverter having an input coupled to an output of the timer and having an output coupled to an input of the maximum input supply selection logic.

9. The maximum input supply selection circuit of claim 1, wherein:
   the plurality of input supply voltages comprises a low supply voltage from a low voltage battery;
   the comparator enable logic is configured to disable the parallel array of comparators using the comparator enable signal if the plurality of input supply detection signals indicates only the low supply voltage is detected out of the plurality of input supply voltages; and
   the maximum input supply selection logic is configured to generate one of the plurality of control signals to control one of the plurality of switches coupled between the low voltage battery and the common output to select the low supply voltage as the maximum input supply voltage, in response to the parallel array of comparators being disabled.

10. The maximum input supply selection circuit of claim 9, wherein the low supply voltage comprises a coin voltage and wherein the battery comprises a coin cell configured to generate the coin voltage.

11. The maximum input supply selection circuit of claim 1, wherein the parallel array of comparators comprises:
   a first comparator having a positive input configured to receive a first one of the plurality of input supply voltages, having a negative input configured to receive a second one of the plurality of input supply voltages, having a positive output configured to generate a first one of the plurality of selection signals, having a negative output configured to generate a second one of the plurality of selection signals, and having an enable input configured to receive the comparator enable signal; and
   a second comparator having a positive input configured to receive the first one of the plurality of input supply voltages, having a negative input configured to receive a third one of the plurality of input supply voltages, having a positive output configured to generate a third one of the plurality of selection signals, having a negative output configured to generate a fourth one of the plurality of selection signals, and having an enable input configured to receive the comparator enable signal.

12. The maximum input supply selection circuit of claim 11, wherein the parallel array of comparators further comprises a third comparator having a positive input configured to receive the second one of the plurality of input supply voltages, having a negative input configured to receive the third one of the plurality of input supply voltages, having a positive output configured to generate a fifth one of the plurality of selection signals, having a negative output configured to generate a sixth one of the plurality of selection signals, and having an enable input configured to receive the comparator enable signal.

13. The maximum input supply selection circuit of claim 12, wherein the maximum input supply selection logic comprises:
   a first logical AND gate having a first input coupled to the positive output of the first comparator and having a second input coupled to the positive output of the second comparator;
   a second logical AND gate having a first input coupled to the negative output of the first comparator and having a second input coupled to the positive output of the third comparator;
   a third logical AND gate having a first input coupled to the negative output of the second comparator and a second input coupled to the negative output of the third comparator;
   a first logical NAND gate having a first input coupled to an output of the first logical AND gate;
   a second logical NAND gate having a first input coupled to an output of the second logical AND gate;
   a third logical NAND gate having a first input coupled to an output of the third logical AND gate;
   a first logical OR gate having a first input coupled to an output of the first logical NAND gate and having a second input configured to receive the gating signal;
   a second logical OR gate having a first input coupled to an output of the second logical NAND gate and having a second input configured to receive the gating signal; and
   a third logical OR gate having a first input coupled to an output of the third logical NAND gate and having a second input configured to receive the gating signal, wherein:
   an output of the first logical OR gate is coupled to a second input of the second logical NAND gate, to a second input of the third logical NAND gate, and to a control input of a first one of the plurality of switches;
   an output of the second logical OR gate is coupled to a second input of the first logical NAND gate, to a third input of the third logical NAND gate, and to a control input of a second one of the plurality of switches; and
   an output of the third logical OR gate is coupled to a third input of the first logical NAND gate, to a third input of the second logical NAND gate, and to a control input of a third one of the plurality of switches.

14. A power management integrated circuit (PMIC) comprising at least a portion of the maximum input supply selection circuit of claim 1.

15. A method of supplying power, comprising:
receiving, at a parallel array of comparators and at a plurality of input supply detectors, a plurality of input supply voltages;
generating, with the parallel array of comparators, a plurality of selection signals based on the plurality of input supply voltages;
generating, with the plurality of input supply detectors, a plurality of input supply detection signals based on the plurality of input supply voltages;
generating, with comparator enable logic coupled between outputs of the plurality of input supply detectors and one or more inputs of the parallel array of comparators, a comparator enable signal based on the plurality of input supply detection signals;
generating, with maximum input supply selection logic having inputs coupled to outputs of the parallel array of comparators, a plurality of control signals;
generating, with comparator settling logic coupled between the outputs of the plurality of input supply detectors and one or more inputs of the maximum input supply selection logic, a gating signal based on at least one of the plurality of input supply detection signals, wherein the maximum input supply selection logic is configured to generate the plurality of control signals based on the plurality of selection signals and the gating signal; and
selecting, with a plurality of switches having control inputs coupled to outputs of the maximum input supply selection logic and having a common output, between the plurality of input supply voltages based on the plurality of control signals for outputting a maximum input supply voltage at the common output.

16. The method of claim 15, further comprising concurrently enabling or disabling comparators in the parallel array of comparators based on the comparator enable signal.

17. The method of claim 15, further comprising powering at least one of the parallel array of comparators, the plurality of input supply detectors, the comparator enable logic, the maximum input supply selection logic, or the comparator settling logic with the maximum input supply voltage.

18. The method of claim 15, further comprising generating, with a biasing circuit comprising a current source powered by the maximum input supply voltage, a biasing ready signal based on the maximum input supply voltage.

19. The method of claim 18, wherein at least one of:
generating the comparator enable signal comprises generating the comparator enable signal based on the plurality of input supply detection signals and the biasing ready signal; or
generating the gating signal comprises generating the gating signal based on the at least one of the plurality of input supply detection signals and the biasing ready signal.

20. The method of claim 15, wherein:
the plurality of input supply voltages comprises a low supply voltage from a low voltage battery;
the method further comprises disabling, with the comparator enable logic, the parallel array of comparators using the comparator enable signal if the plurality of input supply detection signals indicates only the low supply voltage is detected out of the plurality of input supply voltages;
in response to the parallel array of comparators being disabled, generating the plurality of control signals with the maximum input supply selection logic comprises generating one of the plurality of control signals to control one of the plurality of switches coupled between the low voltage battery and the common output to select the low supply voltage as the maximum input supply voltage;
the low supply voltage comprises a coin voltage; and
the battery comprises a coin cell configured to generate the coin voltage.

* * * * *